United States Patent Office 3,813,311

Patented May 28, 1974

3,813,311

PROCESS FOR ETCHING SILICON WAFERS

Roger W. Beck, Kokomo, and Douglas J. Yoder, Sharpsville, Ind., assignors to General Motors Corporation, Detroit, Mich.

No Drawing. Filed Jan. 24, 1973, Ser. No. 326,231
Int. Cl. H01l 7/50
U.S. Cl. 156—17 2 Claims

ABSTRACT OF THE DISCLOSURE

A method for etching silicon wafers with improved control of wafer flatness. Wafers are initially etched in a hydrofluoric acid rich etchant containing nitric acid and acetic acid, and then etched a second time in a nitric acid rich etchant containing hydrofluoric acid and acetic acid.

BACKGROUND OF THE INVENTION

This invention relates to the etching of silicion wafers, and more particularly to a distinctive method of etching silicon wafers that maintains wafer flatness even during extensive surface etching.

Silicon wafers are customarily etched to remove work damage prior to mechanical polishing, as a preparation for processing the wafers into discrete semiconductor devices. Silicon wafers may also be etched during the processing itself, such as in the manufacture of mesa-type devices, where unwanted diffusion areas are removed. The etchants conventionally used for silicon wafers are mixtures containing 60%–90% by volume concentrated nitric acid and the balance concentrated hydrofluoric acid. The nitric acid rich etchants are preferred because they are less sensitive to temperature and concentration variations and produce polished, stain free finished wafer surfaces. Unfortunately, the nitric acid rich etchants do not attack the wafer surfaces uniformly. They etch the outer edges of the wafers more than the wafer centers, tending to round the wafers and reduce surface flatness. As a result, the precise ratio of nitric acid to hydrofluoric acid used in the etchant will vary, and is a compromise that most consistently provides the etch rate, surface finish, and wafer flatness needed for a given application. However, results obtained with all of these mixtures are also subject to the basket design used to hold the wafers during etching, which introduces further nonuniformities in wafer flatness.

Nitric acid-hydrofluoric acid mixtures containing less than 30% by volume concentrated nitric acid have been examined in the past. However, they do not polish well and often leave a film or stain on the wafer surface. Also, these hydrofluoric acid rich mixtures are generally more difficult to control. They etch at an unduly high rate, and generally are more temperature and concentration sensitive than the nitric acid rich etchants. On the other hand, we have recognized that these mixtures produce little or no rounding of the wafer and, where thickness variations do occur, the wafer is apt to be thinner in the center than at the edges. In addition, we have found a range in composition for a modified hydrofluoric acid rich etchant that has a slower etch rate and reduced sensitivity to etching variables.

Our attempts to find a compromise hydrofluoric acid-nitric acid composition that would produce satisfactory results were not successful. No single mixture providing all of the advantages desired could be found.

On the other hand, we have recognized that both the nitric acid rich and hydrofluoric acid rich etchants can be modified by additions of concentrate acetic acid to diminish some of their undesirable properties, while preserving their desirable properties. In addition, we have discovered that the resultant properties of modified hydrofluoric acid rich and nitric acid rich etchants can be coupled in a double etching process that provides the advantages of each without the usual disadvantages. Our double etching process is much less sensitive to etching variables and will consistently produce wafers of extreme flatness, even under commercial production conditions.

OBJECTS AND SUMMARY OF THE INVENTION

It is therefore an object of this invention to provide an improved method of etching silicon wafers.

The method of this invention involves initially etching clean silicon wafers in a hydrofluoric acid rich mixture of concentrated nitric, hydrofluoric and acetic acids, immersing the wafers in concentrated acetic acid, and then etching the wafers a second time in a nitric acid rich mixture of concentrated nitric, hydrofluoric and acetic acids.

DESCRIPTION OF THE PREFERRED EMBODIMENTS

The process of this invention can be used for thinning sawed or lapped wafers to obtain a damage-free polished surface without appreciable loss of flatness. Any type of etch basket may be used, providing the wafers are free to move and do not remain fixed in contact with any part of the basket.

The starting wafers should be as clean as possible. Wafer cleanliness is even more important to our process than prior etching processes. Our initial etchant, a hydrofluoric acid rich mixture, does not rapidly attack organic contaminants, such as wax, oils, etc. Such contaminants on the wafer surface can lead to nonuniformities in wafer etching. Any of the usual precleaning steps can be used, including rinses in organic solvents or the like. However, wafer cleanliness can be insured by immersing the wafers in 95% sulfuric acid (an aqueous sulfuric acid solution having a specific gravity of 1.834) at approximately 100° C. for about 10 minutes.

In our preferred process, the wafers are removed from the hot sulfuric acid and thoroughly rinsed in deionized water. They are then dipped for several seconds in concentrated acetic acid as a final preparation for the initial etch.

After removal from the concentrated acetic acid, the wafers are immediately immersed in the initial etchant. Excellent results have been obtained with an initial etchant of 1,000 milliliters concentrated hydrofluoric acid, 20 milliliters concentrated nitric acid and 200 milliliters concentrated acetic acid. By concentrated hydrofluoric acid, as used in describing this invention, we mean an aqueous solution containing 49.5% by weight hydrofluoric acid and having a specific gravity of 1.20. By concentrated nitric acid as used in describing this invention we mean an aqueous solution containing 70.0% by weight nitric acid and having a specific gravity of 1.42. By concentrated acetic acid as used in describing this invention we mean an aqueous solution containing 99.7% by weight acetic acid and having a specific gravity of 1.05.

In our preferred example the initial etchant contains 16.4% by volume concentrated acetic acid. However, this precise proportion is not unduly critical and can be varied from 15% to 20%. In some instances satisfactory results can be obtained with concentrated acetic acid proportions as low as 10% and as high as 25%. However, the higher the actic acid ratio the more likely one is to encounter etching irregularities, etchant temperature sensitivity, and other problems. The concentrated nitric and hydrofluoric acid proportion will correspondingly vary, as they constitute the balance of the etchant. However, they should always be present in a mutual ratio of from 1:20 to 1:100 by volume concentrated nitric acid to concentrated hydrofluoric acid with the preferred ratio being 1:50.

The initial etchant is most conveniently used at room temperature, where it has an etch rate of 0.5 mil per minute that is not especially sensitive to minor temperature variations. However, higher or lower etchant temperatures can be used. Also, while the wafers are being etched, it is desirable that they be agitated to insure thorough contact with the etchant. After the desired amount of silicon has been removed from the wafer surfaces, the wafers are removed from the initial etchant, and transferred rapidly to deionized water to quench the etching process. The wafers are then thoroughly rinsed in deionized water, and dipped in concentrated acetic acid again for a few seconds.

The wafers are removed from the concentrated acetic acid and immediately immersed into the second etchant. For the second etchant we prefer one containing 1,000 milliliters concentrated nitric acid, 100 milliliters concentrated hydrofluoric acid and 200 milliliters concentrated acetic acid. This etchant is also preferably used at room temperature, where the etch rate is about 0.5 mil per minute and not particularly sensitive to minor temperature variations. However, higher and lower etching temperatures can be used. As before, the wafers should be agitated during immersion to insure complete contact with the etchant.

The initial etchant will produce a rough, fairly flat, and stained wafer. Where flatness variations occur, the wafers tend to be dished, thinner in the center, rather than rounded. The second etchant smooths and polishes the wafer, cleans away the stain, and tends to round the wafer edges. To compensate for dishing produced by the first etchant, a short immersion in the second etchant is needed. Immersion time of course will vary depending on the etch rate of the particular composition and temperature used, and the extent of dishing caused by the first etchant. In most instances immersion in the second etchant should be at least about twenty seconds and should not exceed two minutes, where the etch rate is 0.5 mil per minute. It is generally desirable to remove about 0.5 mil of silicon per surface in the second etchant.

The second etchant described contains 15.3% by volume concentrated acetic acid. However, as with the initial etchant, this proportion can be varied somewhat, as for example, from 13%–18% by volume, and in some instances from 10% to 20% by volume. On the other hand, the volumetric ratio of concentrated nitric acid to concentrated hydrofluoric acid should be maintained within 5:1 to 20:1, respectively.

After the wafers have been etched for the desired time in the second etchant they are immediately transferred to deionized water and thoroughly rinsed, whereupon they are ready for subsequent processing.

It is to be understood that although this invention has been described in connection with certain specific examples thereof no limitation is intended thereby except as defined in the appended claims.

What is claimed is:

1. A method for etching silicon wafers without impairing surface flatness and inducing attendant variations in wafer thickness, said method comprising:

immersing a plurality of silicon wafers in hot concentrated sulfuric acid, rinsing said wafers in deionized water, immersing said wafers in a first etchant containing 10%–25% by volume concentrated acetic acid and the balance concentrated nitric acid and concentrated hydrofluoric acid in a volumetric ratio respectively of from 1:20 to 1:100 to uniformly etch away surfaces of said wafers to a predetermined depth while substantially maintaining wafer surface flatness, rinsing said wafers in deionized water after a predetermined surface thickness has been removed from the wafers, immersing said wafers in concentrated acetic acid, immersing said wafers in a second etchant containing 10%–25% by volume concentrated acetic acid and the balance concentrated nitric acid and concentrated hydrofluoric acid in a volumetric ratio of 5:1 to 20:1, respectively, to remove less than about one mil per wafer surface, and rising said wafers in deionized water and drying said wafers.

2. A method for etching silicon wafers without impairing surface flatness and inducing attendant variations in wafer thickness, said method comprising:

immersing a plurality of silicon wafers in hot concentrated sulfuric acid, rinsing said wafers in deninized water, immersing said wafers in a first etchant containing 15%–20% by volume concentrated acetic acid and the balance concentrated nitric acid and concentrated hydrofluoric acid in a volumetric ratio respectively of from 1:20 to 1:100 to uniformly etch away surfaces of said wafers to a predetermined depth while substantially maintaining wafer surface flatness, rinsing said wafers in deionized water after a predetermined surface thickness has been removed from the wafers, immersing said wafers in concentrated acetic acid, immersing said wafers in a second etchant containing 13%–18% by volume concentrated acetic acid and the balance concentrated nitric acid and concentrated hydrofluoric acid in a volumetric ratio of 5:1 to 20:1 respectively for about 20 seconds to 2 minutes, and rinsing said wafers in deionized water and drying said wafers.

References Cited

UNITED STATES PATENTS

| | | | |
|---|---|---|---|
| 2,899,344 | 8/1959 | Atalla et al. | 156—17 X |
| 3,272,748 | 9/1966 | Szkudlapski | 252—79.3 |

WILLIAM A. POWELL, Primary Examiner

U.S. Cl. X.R.

252—79.3